United States Patent [19]

Nelson et al.

[11] Patent Number: 5,268,085
[45] Date of Patent: Dec. 7, 1993

[54] SELF-ALIGNED SPUTTER DEPOSITION MASKING DEVICE AND METHOD

[75] Inventors: John C. Nelson, Roanoke, Va.; Peng-Kuen Chiang, Torrance, Calif.; David W. Hively, Roanoke, Va.

[73] Assignee: ITT Corporation, New York, N.Y.

[21] Appl. No.: 874,307

[22] Filed: Apr. 24, 1992

[51] Int. Cl.$^5$ .............................................. C23C 14/34
[52] U.S. Cl. ............................ 204/298.11; 204/298.15
[58] Field of Search ........................ 204/298.11, 298.15

[56] References Cited

U.S. PATENT DOCUMENTS

| | | | |
|---|---|---|---|
| 3,897,324 | 7/1975 | Del Monte et al. | 204/298.11 |
| 4,013,533 | 3/1977 | Cohen-Solal et al. | 204/298.11 X |
| 4,473,455 | 9/1984 | Dean et al. | 204/298.15 |
| 4,745,878 | 5/1988 | Sagawa | 204/298.11 X |

Primary Examiner—Nam Nguyen
Attorney, Agent, or Firm—Arthur L. Plevy; Patrick M. Hogan

[57] ABSTRACT

The present invention is a device and method for masking a predetermined area on a surface during sputter deposition. The present invention includes a plurality of alignment arms that extend above the surface to be sputter coated and terminate above the periphery of the area to be masked. A masking member is formed to have a profile that exactly matches the area to be masked. The alignment arms prevent the masking member from contacting the surface to be sputter coated until the masking member is properly oriented and aligned above the area to be masked. The masking member then passes through the alignment arms, masking the desired area, while the alignment arms prevent the masking member from moving away from the desired masked area.

20 Claims, 4 Drawing Sheets

SELF-ALIGNED SPUTTER DEPOSITION MASKING DEVICE AND METHOD

FIELD OF THE INVENTION

The present invention relates to masking devices and methods that mask specified areas on an object or substrate during sputter deposition and, more particularly, to such masking devices and methods that include a self-alignment means that reduces the time and labor required to precisely position a reusable mask over a desired area.

BACKGROUND OF THE INVENTION

Sputtered deposition is a well known technology used to deposit desired materials onto many different items. However, in certain applications, the uniform deposition of sputtered materials across an entire surface of an item is not desired. Many applications require that sputtered materials be deposited in only specific predetermined areas of a single surface. Consequently, the remaining areas of the surface must be covered with a mask, or otherwise shielded, to prevent the deposition of materials onto these areas. A person skilled in the art of sputter deposition will recognize that there exist many types and forms of masks that can be used to shield a desired area, often the form of the mask being dependent on the type and size of the area being shielded. However, a common feature of many masks is that they require a great amount of time and labor to apply and remove from a surface, before and after sputter deposition. If the position of the mask is critical to the eventual operating performance of the item being sputter coated, the time and labor used to meticulously position or align the mask, obviously increases. Similarly, if a mask is placed over an extremely delicate or sensitive surface, great care and, consequently time, must be used when applying and removing the mask from the sensitive surface it covers.

An example of a typical labor intensive, time consuming, prior art masking apparatus and method can be seen by referring to FIG. 1. In FIG. 1, the item on which materials are being sputtered is a photocathode 10, such as the photocathode used in the Generation III image intensifier tube manufactured by ITT Corporation, the assignee herein. The photocathode 10 is generally formed of glass wafer 12 having a concentric raised midregion 14. The raised midregion 14 is coated with a thin sensitive layer of a photoemissive material 16 such as gallium arsenide (GaAs). During sputter deposition, an annular area 18 of chromium is sputtered onto the photocathode 10. The annular area 18 of chromium, coats the region of the photocathode inbetween the raised midregion 14 and a peripheral region 20 on the glass wafer 12. As can be seen, the peripheral region 20 and the center of the raised midregion 14 must be masked prior to the sputter deposition procedure, in order to create the desired annular area 18 of chromium.

To describe the amount of labor and time consumed in sputtering the annular area 18 of chromium onto the above-described photocathode 10, consider the following masking procedure, while referencing FIG. 1. In anticipation of the sputtering procedure, a photocathode 10 is placed into a holding receptacle 22 in a sputter deposition apparatus, such that the raised midregion 14 of the photocathode 10 faces a sputter cathode. To mask the peripheral region 20 of the photocathode 10, preventing the deposition of chromium onto the peripheral region 20, an annular mask 26 is placed over the photocathode 10. To shield the center of the raised midregion 14, a glass masking disk 30 is placed onto the exact center of the midregion 14, such that the glass masking disk 30 contacts the photoemissive material 16. The glass masking disk 30 is centered by an operator utilizing a microscope, referencing the glass masking disk 30 with respect to the outside diameter of the raised midregion 14. If realignment is necessary, an operator must pull the glass masking disk 30 free from the photoemissive material 16 using great care not to damage the underlying photoemissive material 16.

With the glass masking disk 30 properly centered and in place, the retaining fixture 32 is placed over the glass masking disk 30 and the photocathode 10 so as to not disturb the placement of the glass masking disk 30. The retaining fixture 32 includes a contact plate 34, suspended by three arms 36, that abuts against the glass masking disk 30, holding it against the photocathode 10. The retaining fixture 32 is bolted to the sputter deposition apparatus, at points adjacent to the base receptacle 22, using bolts 38 that pass through shaped catch washers 40. Once the bolts 38 are tightened, the alignment of all the elements is again checked by the operator. Similarly, the glass masking disk 30 and photocathode 10 are checked, by the operator, to see if they are properly seated in the base receptacle 22. The operator checks the glass masking disk 30 and the photocathode 10 by pressing the glass masking disk 30 downward with a pair of tweezers at one hundred and twenty degree intervals. If the photocathode 10 moves while the glass masking disk 30 is depressed, the retaining fixture 32 is not properly seated and the entire loading procedure is aborted and begun anew.

The masking technique described in relation to FIG. 1 is highly time consuming and labor intensive. The labor intensive manufacturing process creates many other problems such as, scratch damage to the photoemissive material 16, from the constant repositioning of the glass masking disk 30 by the operator, the misalignment of the glass masking disk 30 by the operator creating a non-concentric deposition, and damage to the photocathode during the removal of the mask. Such errors in manufacturing result in a substantial amount of rejected parts that result in waste and increased manufacturing costs.

Another manufacturing problem, inherent in the described prior art masking method, is that the support arms 36 of the retaining fixture interfere with the sputter deposition of chromium onto the photocathode 10. The shadowing effect of the support arms 36 over the photocathode 10 can create non-uniformity of etch and sputter, which can result in eventual peeling of the deposited chrome and failure in the operation of the photocathode 10.

It is therefore a primary objective of the present invention to set forth a masking device and method wherein a predetermined area on a surface can be masked from sputter deposition in a labor and time effective manner and waste can be substantially reduced by removing operator judgment from the masking procedure.

SUMMARY OF THE INVENTION

The present invention relates to a device and method for masking a predetermined area on a surface, during a sputter deposition procedure. The present invention includes a support fixture that surrounds the periphery of the surface being coated by the sputter deposition. The support fixture supports a plurality of alignment arms that extend inwardly, above the surface to be coated, in such a manner that the alignment arms do not interrupt the sputter etch of deposited material below each arm. The alignment arms each terminate above the periphery of the area that is to be masked. A dielectric masking member is made with a profile that matches the area on the surface that is to be masked. The masking member fits inbetween each of the alignment arms and exactly contacts the area on the surface to be masked. The alignment arms contact the masking member from a plurality of directions, assuring that the masking member can not move on the surface away from the desired area to be masked. Additionally, since the alignment arms conform to the periphery of the area to be masked, the alignment arms prevent the masking member from contacting the surface to be coated, unless the masking member is properly oriented and aligned inbetween the alignment arms.

The support fixture surrounding the periphery of the surface being coated can be formed to partially overlap and contact the peripheral regions of the surface that is being sputter coated. By overlapping and contacting the surface being coated, the support fixture itself can act as a mask, masking the peripheral regions of the surface to be coated, corresponding to the size and shape of the overlap.

BRIEF DESCRIPTION OF THE DRAWINGS

For a better understanding of the present invention, reference is made to the following description of an exemplary embodiment thereof, considered in conjunction with the accompanying drawings, in which.

DETAILED DESCRIPTION OF THE INVENTION

Although the present invention can be used in many varied applications where any shaped area on a surface must be masked from sputter deposition, the present invention is particularly suitable for use in connection for masking substantially planar surfaces such as those found on a photocathode. Accordingly, the described embodiment of the present invention will be directed toward a masking device and method for masking a photocathode, such as the ITT Generation III image intensifier tube photocathode, previously shown in the described example of the prior art.

Figure 1:
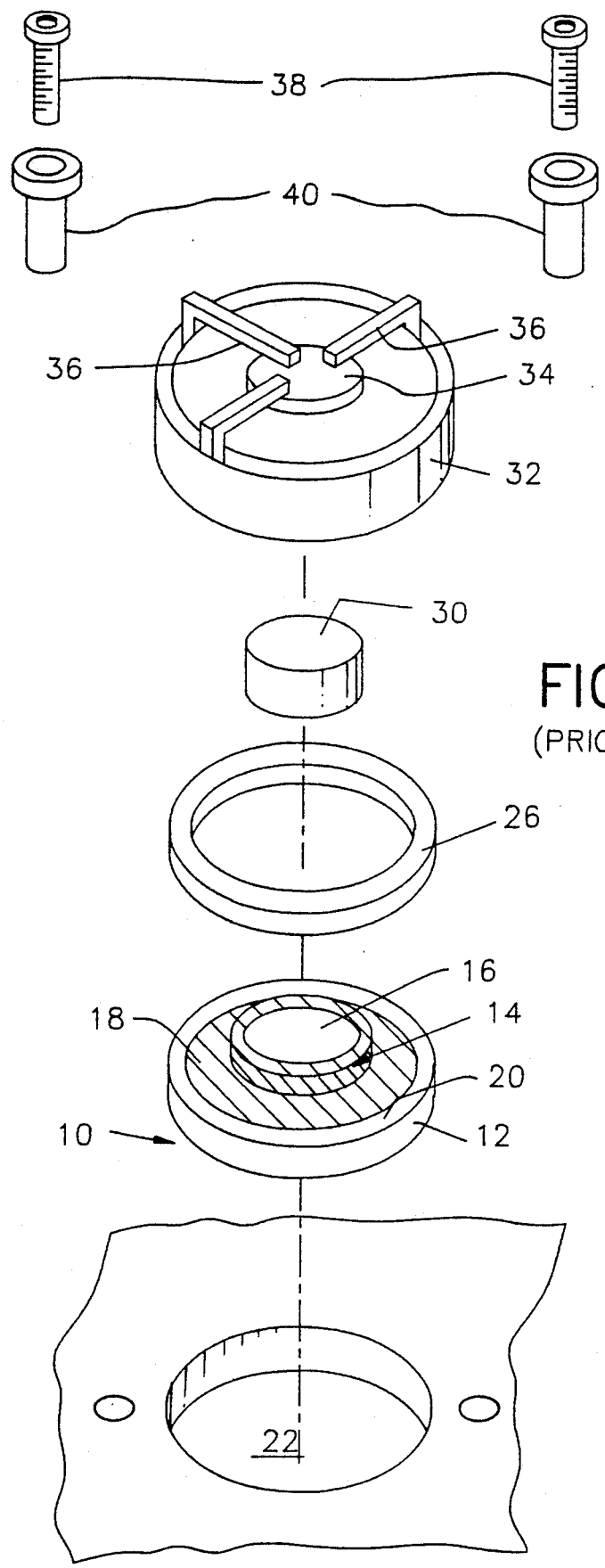
FIG. 1 is an exploded, perspective view of a prior art masking device used to mask specific areas of a photocathode during sputter deposition.
Figure 2:
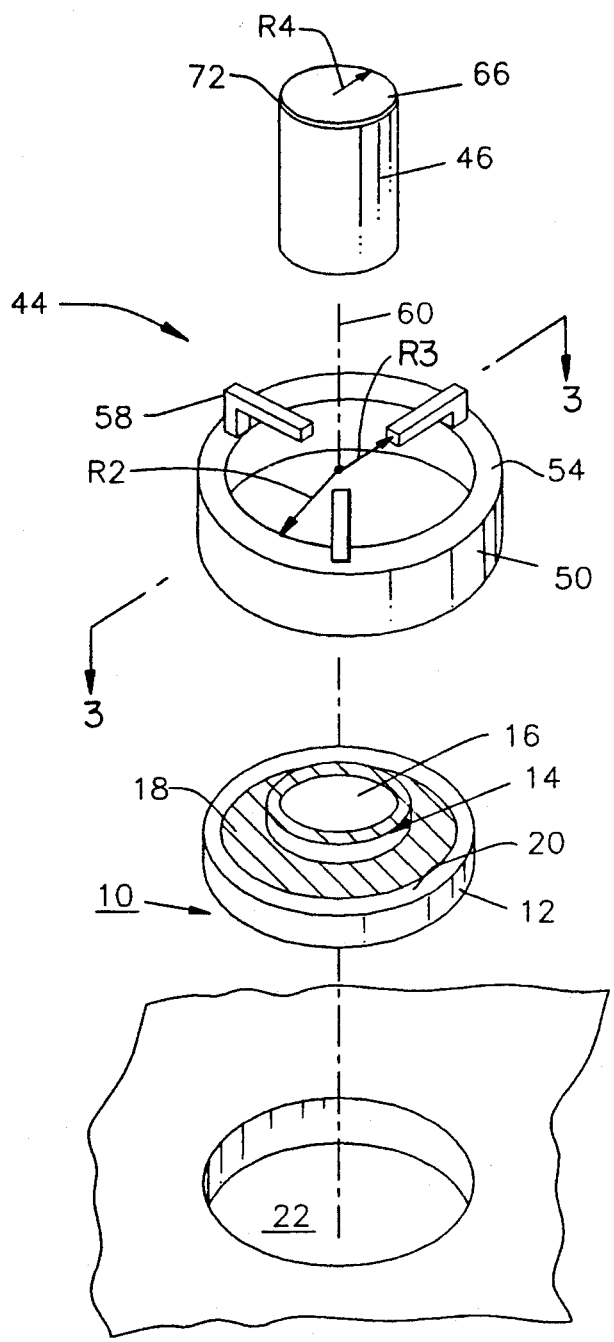
FIG. 2 is an exploded, perspective view of one preferred embodiment of the present invention masking device.

Referring to FIG. 2, a photocathode 10 is shown in conjunction with the present invention masking device. The photocathode 10 is the same photocathode as was previously shown in FIG. 1. As such, the reference numerals identifying the photocathode in FIG. 1 are maintained in FIG. 2. As is seen in FIG. 2, the photocathode 10 has a raised midregion 14 which is coated with a photoemissive material 16. During sputter deposition, chromium is deposited in an annular area 18 onto the photocathode 10 such that only the central region of the photoemissive material 16 and the peripheral region 20 remain uncoated. As has been previously explained in relation to the prior art, it is important to concentrically position the deposited annular area 18 onto the photocathode 10 to assure proper operational performance of the photocathode 10 during use.

Figure 3:
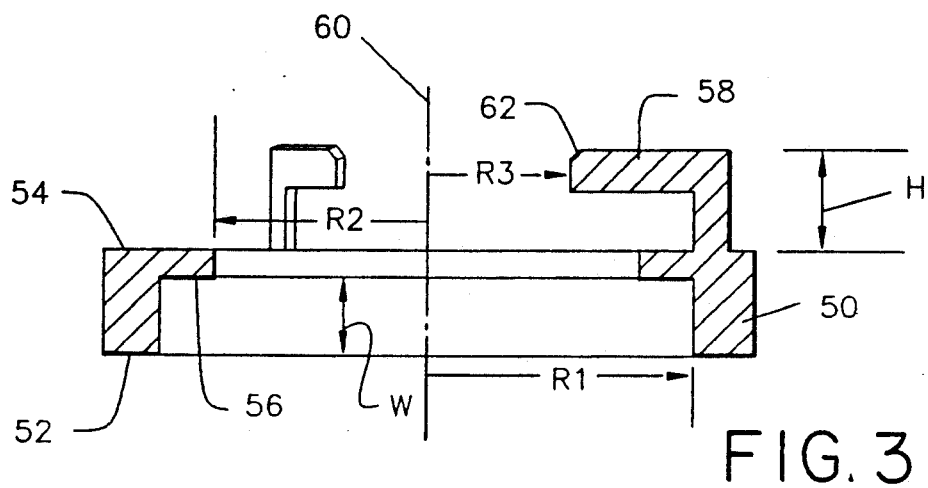
FIG. 3 is a cross-sectional view of the retaining fixture component of the present invention masking device shown in FIG. 2, viewed along section line 3—3.

The present invention masking device includes a retaining fixture 44 and a corresponding masking disk 46. Referring to FIG. 3 in conjunction with FIG. 2, it can be seen that the retaining fixture 44 is formed from a ring member 50 having a substantially L-shaped cross-sectional profile. Consequently, the ring member 44 has a center aperture with an inner radius of R1 formed through bottom surface 52 and an internal radius of R2 formed through the opposing top surface 54. Additionally, the L-shaped profile of the ring member 50 creates a ledge 56 within the ring member 50 where the inner radius suddenly changes from inner radius R1 to smaller inner radius R2. The inner radius R1 of the ring member 50 is at least as large as the largest radius of the photocathode 10. The smaller inner radius R2 of the ring member 50, is larger than the radius of the raised midregion 14 of the photocathode 10, corresponding in size to the outer radius of the annular area 18. The width W of the ring member 50, inbetween the bottom surface 52 and the ledge 56, is at least as deep as the width of the photocathode 10, neglecting raised midregion 14.

Symmetrically disposed, on the top surface 54 of the ring member 50, are a plurality of alignment arms 58. Each alignment arm 58 is identical in shape and form and extends to a height H above the top surface 54 of the ring member 50. Each alignment arm 58 extends inwardly over the ring member 50, toward the center axis 60 of the ring member 50. As such, each alignment arm extends over the center aperture formed through the ring member 50. The alignment arms 58 are identical in shape and size, and are symmetrically disposed along the ring member 50. Consequently, each alignment arm 58 terminates in a contact edge 62 that is a radius R3 from the center axis 60 of the ring member 50. The radius R3 separating the contact edge 62, of each alignment arm 58, to the center axis 60 is substantially the same size as the outer radius R4 of the masking disk 46. Additionally, the contact edges 62 of each alignment arm 58 are tapered in such a manner to facilitate the passage of the masking disk 46 inbetween the alignment arms 58.

Figure 4:
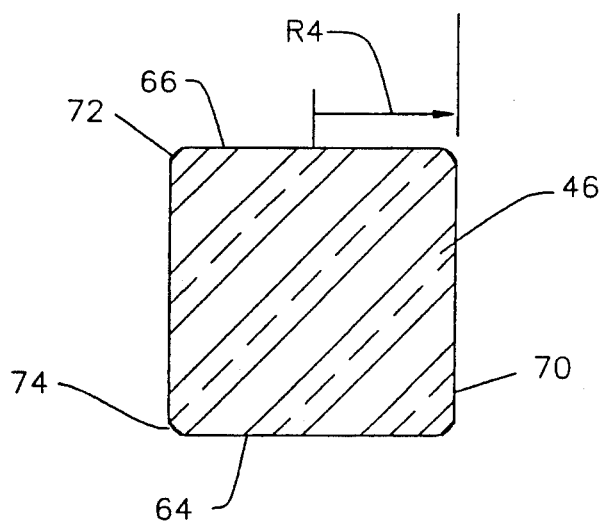
FIG. 4 is a cross-sectional view of the glass masking disk component of the present invention masking device shown in FIG. 2, viewed along section line 4—4.

Referring to FIG. 4 in conjunction with FIG. 2, the construction of the masking disk 46 can be detailed. The masking disk 46 is preferably formed of glass such as Corning 7056 glass. However, it should be understood that the masking disk 46 can be formed of any glass, ceramic or other dielectric material. The masking disk 46 is cylindrical in shape, having a top surface 66, a bottom surface 68 and a continuous side surface 70. The top edge 72, joining the top surface 66 to the side surface 70, and the bottom edge 74, joining the bottom surface 64 to the side edge 70, are beveled to facilitate the passage of the masking disk 46 into the alignment arms 58 of the alignment fixture 44. As can be seen, the masking disk 46 is symmetrically formed so that it remains the same shape regardless of whether the masking disk 46 is upright or inverted.

Figure 5:
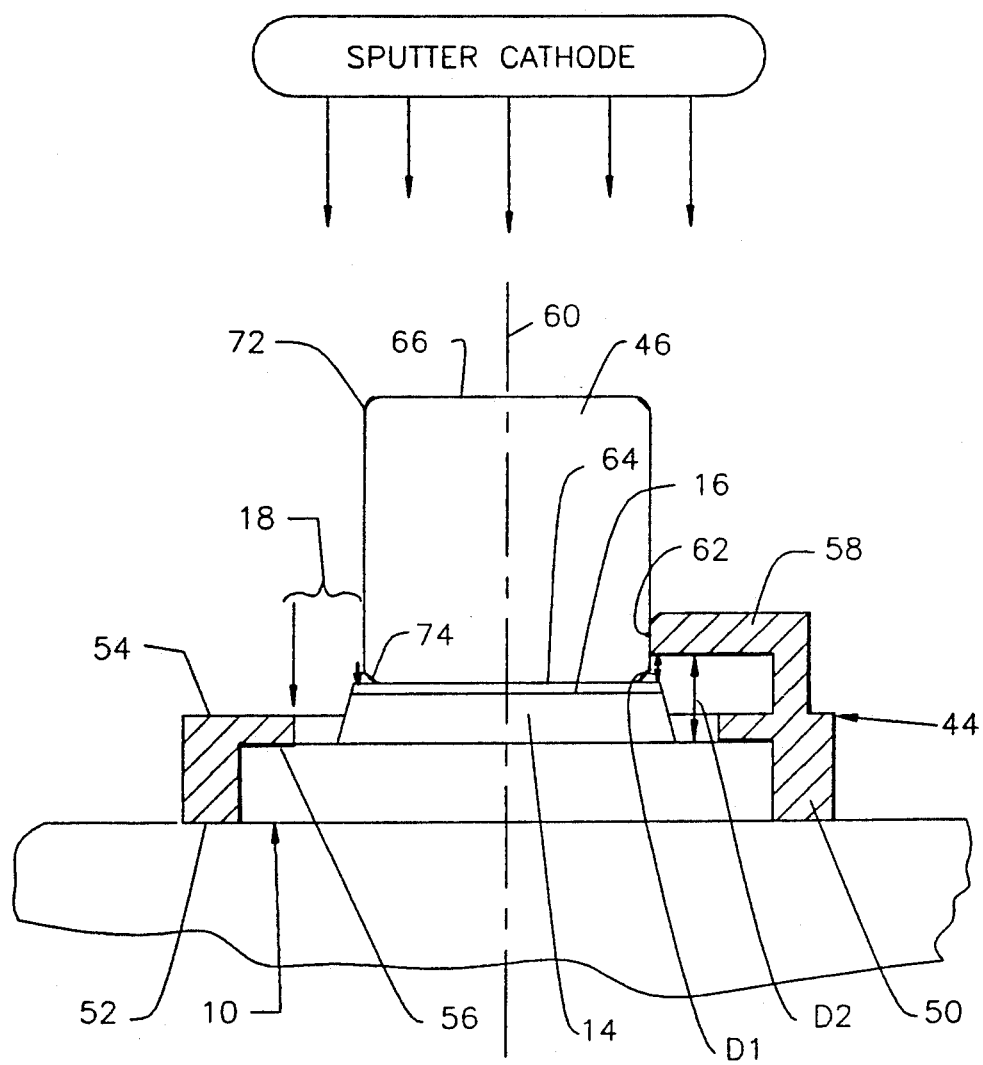
FIG. 5 is a cross-sectional view of the present invention masking device in combination with a photocathode as it would appear during a sputter deposition procedure.

In FIG. 5, the components of FIG. 1 are shown in cross-section in an unexploded manner. Referring to FIG. 5 in conjunction with FIG. 1, the use of the present invention, in masking the photocathode 10 during sputter deposition, can be explained. As with prior art methods, the photocathode 10 is positioned in a receptacle 22, within a sputter deposition apparatus, such that the raised midregion 14 of the photocathode 10 faces a sputter cathode. The present invention alignment fixture 44 is placed around the photocathode 10 so that the bottom surface 52 of the ring member 50 contacts the base receptacle 22. The ring member 50 is dimensioned so that the photocathode 10 abuts against the ledge 56, formed within the ring member 50, as the ring member 50 contacts the receptacle 22. The alignment fixture 44 is symmetrically disposed around center axis 60. Since the photocathode 10 is round and form fits into the ring member 50, the photocathode 50 and alignment fixture 44 become concentrically positioned when the alignment fixture 44 is placed around the photocathode 10. The abutment of the photocathode 10 against the ledge 56 inside the ring member 50, results in the ring member 50 partially overlapping the photocathode 10. As would be apparent to a person skilled in the art, the area of the photocathode 10 overlapped by the ledge 56 of the ring member 50 will be masked from the sputter deposition. In the chosen example of a photocathode 10, it is desired that the peripheral region 20 of the photocathode not be coated with chrome from the sputter deposition process. By controlling the length of the ledge 56, the ring member 50 can be formed so that the peripheral region of the photocathode 10 is masked, without the need for an additional annular mask as is required by the prior art.

With the alignment fixture 44 concentrically positioned around the photocathode 10, the center of the raised midregion 14 of the photocathode is disposed about the same center axis 60 as the alignment arms 58. The masking disk 46 is inserted inbetween the alignment arms 56 of the alignment fixture 44 until either the top surface 66 or the bottom surface 64 of the masking disk 46 abuts against the raised midregion 14 of the photocathode 10. The outer radius R4 of the masking disk 46 is almost the same size as the radius R3 between the contact edges 62 of the alignment arms 58 and the center axis 60. The outer radius R4 of the masking disk 46 is only slightly smaller than the radius R3 of the alignment arms 58 so that the masking disk 46 can pass inbetween the alignment arms 58. As such, the masking disk 46 contacts all the alignment arms 58 when it is placed inbetween the alignment arms 58, and the masking disk 46 is restricted from moving out of a single orientation. Since the fit between the masking disk 46 and the alignment arms 58 has a small dimensional tolerance, both the alignment arms 58 and the masking disk 46 have beveled edges to facilitate the passing the masking disk 46 into the alignment arms 58. A person skilled in the art will also recognize that certain radii of curvature could be used at the edges of the masking disk 46 and alignment arms 58 in place and stead of the bevel.

The masking disk 46 is cylindrically shaped and the alignment arms 58 are of equal shape and symmetrically disposed around center axis 60. Consequently, when the masking disk 46 is passed between the alignment arms 58, the longitudinal axis of the masking disk 46 will align with the center axis 60 of the alignment arms 58. As has been previously explained, the alignment fixture 44 surrounds the photocathode 10 in a concentric manner. As such, the alignment fixture 44 concentrically aligns the masking disk 46, above the raised midregion 14 of the photocathode 10. Since the masking disk 46 abuts against the center of the raised midregion 14, the area in the center of the raised midregion 14, under the masking disk 46, is masked from the sputtered deposition. Additionally, since the alignment arms 58 of the alignment fixture 44 concurrently contact the masking disk 46 from different directions, the movement of the masking disk 46 is severely limited, preventing the masking disk 46 from moving from the center of the raised midregion 14. The restricted movement results in a reduced risk of the masking disk 46 scratching or otherwise damaging the photoemissive material 16 present on the raised midregion 14 of the photocathode 10 and assures the area masked over the raised midregion 14 is concentrically formed.

As is shown in FIG. 5, the juxtaposition of the photocathode 10, alignment fixture 44 and masking disk 46 result in only one annular area 18 of the photocathode 10 being exposed to the sputter deposition procedure. Consequently, only the annular area 18 is sputter coated, giving the desired shaped coating to the photocathode 10. The alignment arms 58 are positioned a distance D1 above the raised midregion 14 of the photocathode 10 and a distance D2 from the base region of the photocathode 10. The distances D1 and D2 as well as the height and width of the alignment arms are designed to produce a more consistent sputter etch than is available from the prior art devices. Since the alignment arms 58 can be used to hold a masking member over many varied surfaces, the width of the alignment arms 58 and height of the alignment arms 58 over the surface to be sputter coated, can be calculated to minimize its affect on sputter etch, using known alpha-step measurement methods.

It will be understood by those skilled in the art that the embodiment described in conjunction with FIGS. 2 through 5 are exemplary, corresponding in form and function to solve a specific task of sputtering an annular area 18 of chrome onto a photocathode 10. The present invention can also be used in conjunction with many other masking tasks and can be used to mask many varied items other than photocathodes. For example, if a masking application required that a rectangular shape be masked on a square substrate, the present invention could be used by substituting a square shaped alignment fixture, using a rectangular shaped masking disk and forming the alignment arms to automatically position the masking disk over the desired area of the square substrate. Similarly, if the area of a surface, desired to be masked, were contoured, the masking disk could also be contoured to fit flush against the masked surface.

In view of the disclosure of the present invention, it is believed that persons skilled in the art can make many variations and modifications to the present invention that are intended to be included within the scope of the present invention. More specifically, the present invention can be customized to mask substantially any shape on substantially any surface by appropriately altering the configuration and dimensions of the invention. In all cases, regardless of the application, the present invention serves to eliminate the labor and time of masking an object by providing a self-aligning fixture for supporting a shaped mask. All such variations and modifications are intended to be included within the scope of the invention as defined in the appended claims.

What is claimed is:

1. A masking device for masking a predetermined area on an object from a deposit material deposited during a sputter deposition procedure, comprising:
   a masking member having a bottom surface and at least one side surface, wherein said bottom surface is sized to exactly cover said predetermined area on said object;
   a plurality of arm members extending above said object, said arm members contacting said at least one side surface of said masking member, thereby aligning said bottom surface of said masking member over said predetermined area so as to exactly mask said predetermined area.

2. The device of claim 1, wherein said masking member is dielectric and has a profile matching said predetermined area whereby said dielectric masking member contacts and masks said predetermined area when aligned by said arm members.

3. The device of claim 2, wherein said arm members prevent the positioning of said masking member onto said object unless said masking member is properly aligned over said predetermined area so as to exactly contact and mask said predetermined area.

4. The device of claim 3, wherein said arm members contact said masking member substantially preventing said masking member from moving laterally away from said predetermined area.

5. The device of claim 4, wherein said arm members are supported by a support fixture positioned beyond the periphery of said object.

6. The device of claim 5, wherein said support fixture overlaps said object contacting and masking a segment of said object from said deposit material in an area corresponding to the size and shape of the overlap.

7. The device of claim 4, wherein said arm members are symmetrically disposed around said masking member when said masking member is contacting and masking said predetermined area.

8. The device of claim 7, wherein said arm members include a bevel at the end of said arm members that contact said masking member to facilitate the passage of said masking member between said arm members.

9. The device of claim 8, wherein said masking member includes a beveled edge to facilitate the passage of said masking member inbetween said arm members.

10. The device of claim 8, wherein said masking member is symmetrically formed so as to be identical in form in either an upright or inverted position.

11. The device of claim 10, wherein said arm members are formed so as not to substantially affect the deposition of said deposit material onto said object below said arm member.

12. The device of claim 7, wherein said masking member has a substantially cylindrical shape.

13. A method for masking a predetermined area of an object from a deposit material deposited during a sputter deposition procedure, comprising the steps of:
   supporting a plurality of alignment arms above said object such that each arm terminates above the periphery of said predetermined area;
   providing a masking member having a bottom surface and at least one side surface, wherein said bottom surface is sized to cover said predetermined area on said object;
   placing said masking member inbetween said alignment arms such that each of said alignment arms contacts said at least one side surface of said masking member, limiting said masking member to one orientation wherein said bottom surface of said masking member contacts and masks said predetermined area on said surface.

14. The method of claim 13, wherein said step of supporting includes placing a support fixture around the periphery of said object wherein said alignment arms depend from said support fixture.

15. The method of claim 14, further including the step of masking a periphery region of said object from said deposit material by placing said support fixture abounds said surface such that said support fixture overlaps and contacts said periphery region.

16. A masking device for masking a predetermined area on a photocathode from a deposit material deposited during a sputter deposition procedure, comprising:
   an alignment fixture positionable around the periphery of said photocathode, said alignment fixture supporting a plurality of alignment arms above said photocathode such that each of said alignment arms terminates above the circumference of said predetermined area; and
   a reuseable dielectric mask, said mask having a circumferential profile substantially matching said predetermined area, such that said mask can pass between said alignment arms and mask said predetermined area, when said mask is properly oriented above said predetermined area.

17. The device of claim 16, wherein said alignment fixture overlaps the periphery of said photocathode, said alignment fixture contacting and masking the periphery of said photocathode from said deposit material in an area corresponding to the size and shape of the overlap.

18. The device of claim 17, wherein said photocathode is circular and said alignment fixture is circular such that said alignment fixture overlaps said photocathode, masking an annular region adjoining the periphery of said photocathode.

19. The device of claim 18, wherein said photocathode is a photocathode for an image intensifier tube and said predetermined area to be masked on said photocathode is circular and concentrically positioned on said photocathode.

20. The device of claim 19, wherein said mask is cylindrical so as to mask said predetermined area, whereby said deposit material is deposited on said photocathode in an annular pattern, concentrically positioned on said photocathode in between said predetermined area, masked by said mask, and said periphery of said photocathode, masked by said alignment fixture.

* * * * *